(12) United States Patent
Kang et al.

(10) Patent No.: US 8,704,235 B2
(45) Date of Patent: Apr. 22, 2014

(54) SEMICONDUCTOR CIRCUIT HAVING CAPACITOR AND THIN FILM TRANSISTOR, FLAT PANEL DISPLAY INCLUDING THE SEMICONDUCTOR CIRCUIT, AND METHOD OF MANUFACTURING THE SEMICONDUCTOR CIRCUIT

(75) Inventors: Chul-Kyu Kang, Yongin (KR); Do-Hyun Kwon, Yongin (KR); Ju-Won Yoon, Yongin (KR); Jong-Hyun Choi, Yongin (KR); June-Woo Lee, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 215 days.

(21) Appl. No.: 12/475,136

(22) Filed: May 29, 2009

(65) Prior Publication Data

US 2009/0302332 A1    Dec. 10, 2009

(30) Foreign Application Priority Data

Jun. 9, 2008    (KR) ........................ 10-2008-0053816

(51) Int. Cl.

| | | |
|---|---|---|
| *H01L 27/14* | (2006.01) | |
| *H01L 29/04* | (2006.01) | |
| *H01L 29/15* | (2006.01) | |
| *H01L 31/036* | (2006.01) | |
| *H01L 29/10* | (2006.01) | |
| *H01L 31/00* | (2006.01) | |
| *H01L 21/00* | (2006.01) | |

(52) U.S. Cl.
USPC ... 257/72; 257/59; 257/E29.273; 257/E51.022; 438/82

(58) Field of Classification Search
USPC ............... 257/88, 296, E21.008, E21.415, 257/E27.112, E33.053, 59, 72, E29.137, 257/E29, 273, E51.022; 438/155, 82, 99, 438/149
See application file for complete search history.

(56) References Cited

U.S. PATENT DOCUMENTS

| | | |
|---|---|---|
| 6,335,148 B2 | 1/2002 | Lee et al. |
| 6,855,960 B2 | 2/2005 | Park et al. |

(Continued)

FOREIGN PATENT DOCUMENTS

| | | |
|---|---|---|
| JP | 2000-228527 A | 8/2000 |
| JP | 2002-107762 | 4/2002 |

(Continued)

OTHER PUBLICATIONS

Office Action for Korean patent application No. 10-2008-0053816 dated Oct. 16, 2009 by Korean Intellectual Property Office.

(Continued)

*Primary Examiner* — Daniel Luke
*Assistant Examiner* — Khaja Ahmad
(74) *Attorney, Agent, or Firm* — Knobbe Martens Olson & Bear LLP

(57) ABSTRACT

A flat panel display including a semiconductor circuit, and a method of manufacturing the semiconductor circuit are disclosed. In one embodiment, the semiconductor circuit includes i) a substrate, ii) a semiconductor layer and a first capacitor electrode formed on the substrate, the first capacitor electrode being doped to be conductive, iii) an insulating layer covering the semiconductor layer and the first capacitor electrode, iv) a gate electrode disposed on the insulating layer and corresponding to a portion of the semiconductor layer, and v) a second capacitor electrode disposed on the insulating layer and corresponding to the first capacitor electrode, wherein the gate electrode is thicker than the second capacitor electrode.

8 Claims, 9 Drawing Sheets

(56) References Cited

U.S. PATENT DOCUMENTS

| | | | |
|---|---|---|---|
| 2001/0006765 A1 | 7/2001 | Lee et al. | |
| 2003/0193284 A1 | 10/2003 | Park et al. | |
| 2005/0116232 A1* | 6/2005 | Kim et al. | 257/72 |
| 2005/0161740 A1* | 7/2005 | Park et al. | 257/347 |
| 2005/0179829 A1 | 8/2005 | Park et al. | |
| 2005/0218407 A1* | 10/2005 | Matsuura et al. | 257/66 |
| 2006/0246360 A1* | 11/2006 | Hwang | 430/5 |
| 2007/0072348 A1* | 3/2007 | Chen | 438/149 |
| 2007/0152217 A1* | 7/2007 | Lai et al. | 257/59 |
| 2007/0200139 A1* | 8/2007 | Shibata et al. | 257/146 |
| 2007/0252145 A1* | 11/2007 | Toyota et al. | 257/59 |
| 2007/0259486 A1* | 11/2007 | Makita | 438/166 |
| 2007/0281401 A1 | 12/2007 | Yamazaki et al. | |
| 2008/0135837 A1* | 6/2008 | Kim et al. | 257/40 |
| 2009/0079341 A1* | 3/2009 | Tsai | 313/504 |

FOREIGN PATENT DOCUMENTS

| | | |
|---|---|---|
| JP | 2004-046087 | 2/2004 |
| JP | 2005-298971 A | 10/2005 |
| KR | 10-2001-0061841 A | 7/2001 |
| KR | 10-2006-0127645 A | 12/2006 |
| KR | 10-2007-0049741 A | 5/2007 |
| KR | 10-2007-0110159 A | 11/2007 |
| KR | 10-2008-0000247 A | 1/2008 |

OTHER PUBLICATIONS

Japanese Office Action dated Jun. 26, 2012 for Japanese Patent Application No. JP 2009-106062 which shares priority of Korean Patent Application No. KR 10-2008-0053816 with captioned U.S. Appl. No. 12/475,136.

* cited by examiner

SEMICONDUCTOR CIRCUIT HAVING CAPACITOR AND THIN FILM TRANSISTOR, FLAT PANEL DISPLAY INCLUDING THE SEMICONDUCTOR CIRCUIT, AND METHOD OF MANUFACTURING THE SEMICONDUCTOR CIRCUIT

CROSS-REFERENCE TO RELATED PATENT APPLICATION

This application claims the benefit of Korean Patent Application No. 10-2008-0053816, filed on Jun. 9, 2008, in the Korean Intellectual Property Office, the disclosure of which is incorporated herein in its entirety by reference.

BACKGROUND OF THE INVENTION

1. Field of the Invention

The present invention relates to a substrate (or a semiconductor circuit) having a capacitor and a thin film transistor (TFT), a flat panel display including the substrate, and a method of manufacturing the substrate, and more particularly, to a substrate having a capacitor and a TFT, a flat panel display including the substrate, and a method of manufacturing the substrate whereby a manufacturing process can be simplified and costs thereof can be reduced.

2. Description of the Related Technology

In general, a substrate having a capacitor and a thin film transistor (TFT) refers to a substrate on which a capacitor and a TFT are formed. The substrate is used to realize active matrix (AM) flat panel displays which control an operation of pixels (subpixels) by using TFTs which are individually and electrically connected to each of the pixels (the subpixels).

SUMMARY OF CERTAIN INVENTIVE ASPECTS

One aspect of the present invention is a substrate having a capacitor and a thin film transistor (TFT), a flat panel display including the substrate, and a method of manufacturing the substrate whereby the manufacturing process can be simplified and costs thereof can be reduced.

Another aspect of the present invention is a substrate having a capacitor and a TFT, the substrate including i) a semiconductor layer and a first capacitor electrode formed on a same layer, the first capacitor electrode being doped to be conductive; ii) an insulating layer covering the semiconductor layer and the first capacitor electrode; and iii) a gate electrode disposed on the insulating layer and corresponding to a portion of the semiconductor layer, and a second capacitor electrode disposed on the insulating layer and corresponding to the first capacitor electrode, wherein a thickness of the gate electrode is greater than a thickness of the second capacitor electrode.

A portion of the semiconductor layer that does not correspond to the gate electrode may be doped with the same dopants as the first capacitor electrode.

A doping density of the portion of the semiconductor layer that does not correspond to the gate electrode may be heavier than a doping density of the first capacitor electrode.

Another aspect of the present invention is a flat panel display including the substrate having the capacitor and the TFT; source and drain electrodes contacting a semiconductor layer of the substrate having the capacitor and the TFT; and a light emitting device electrically connected to at least one of the source and drain electrodes.

Another aspect of the present invention is a method of manufacturing a substrate having a capacitor and a TFT, the method including (a) forming a semiconductor layer to be formed as the TFT, and a semiconductor layer to be formed as a first capacitor electrode, wherein the semiconductor layer for forming the TFT and the semiconductor layer for forming the first capacitor electrode are formed on a same layer; (b) forming an insulating layer to cover the semiconductor layer for forming the TFT and the semiconductor layer for forming the first capacitor electrode; (c) forming a gate electrode corresponding to a portion of the semiconductor layer for forming the TFT on the insulating layer, and forming a second capacitor electrode corresponding to the semiconductor layer for forming the first capacitor electrode on the insulating layer, wherein a thickness of the gate electrode is formed to be greater than a thickness of the second capacitor electrode; and (d) through the insulating layer, doping the semiconductor layer for forming the first capacitor electrode, so that the semiconductor layer for forming the first capacitor electrode becomes conductive.

The operation (c) may include the operation of simultaneously forming the gate electrode and the second capacitor electrode by using a half-tone mask.

The operation (c) may include the operation of forming the gate electrode, which comprises a first conductive layer corresponding to the portion of the semiconductor layer for forming the TFT and a second conductive layer disposed on the first conductive layer, on the insulating layer, and forming the second capacitor electrode corresponding to the semiconductor layer for forming the first capacitor electrode on the insulating layer.

The operation (c) may include the operations of (c1) forming the first conductive layer and the second capacitor electrode on the insulating layer, wherein the first conductive layer and the second capacitor electrode are formed to have the same thickness; and (c2) forming the second conductive layer on the first conductive layer so as to form the gate electrode comprising the first conductive layer and the second conductive layer.

The operation (d) may include the operation of simultaneously doping the semiconductor layer for forming the first capacitor electrode, and a portion that is of the semiconductor layer for forming the TFT and that does not correspond to the gate electrode.

In the operation (d), a doping density of the portion, that is of the semiconductor layer for forming the TFT and that does not correspond to the gate electrode, may be heavier than a doping density of the semiconductor layer for forming the first capacitor electrode.

Another aspect of the invention is a flat panel display, comprising: a semiconductor circuit comprising i) a thin film transistor (TFT), ii) a semiconductor layer and a first capacitor electrode formed on the same layer, the first capacitor electrode being doped to be conductive, iii) an insulating layer covering the semiconductor layer and the first capacitor electrode, iv) a gate electrode disposed on the insulating layer and corresponding to the first capacitor electrode and v) a second capacitor electrode disposed on the insulating layer and corresponding to the first capacitor electrode, wherein the gate electrode is thicker than the second capacitor electrode; source and drain electrodes contacting the semiconductor layer; and a light emitting device electrically connected to at least one of the source and drain electrodes.

In the flat panel display, the gate electrode comprises a first conductive layer corresponding to a portion of the semiconductor layer and a second conductive layer disposed on the first conductive layer.

Another aspect of the invention is a method of manufacturing a semiconductor circuit having a capacitor and a TFT, the method comprising: providing a substrate; forming a buffer layer on the substrate; forming a first semiconductor layer and a second semiconductor layer on the buffer layer, wherein the first semiconductor layer is configured to be formed as the TFT, and wherein the second semiconductor layer is configured to be formed as a first capacitor electrode; forming an insulating layer to cover the first and second semiconductor layers; forming a gate electrode corresponding to a portion of the first semiconductor layer on the insulating layer; forming a second capacitor electrode corresponding to the second semiconductor layer on the insulating layer, wherein the gate electrode is thicker than the second capacitor electrode; and through the insulating layer, doping the second semiconductor layer so that the second semiconductor layer becomes conductive.

In the method, the gate electrode and the second capacitor electrode are substantially simultaneously formed via a halftone mask. In the method, forming the gate electrode comprises: forming a first conductive layer corresponding to the portion of the first semiconductor layer on the insulating layer; and forming a second conductive layer on the first conductive layer. In the method, the first conductive layer and the second capacitor electrode have substantially the same thickness. In the method, the doping comprises substantially simultaneously doping i) the second semiconductor layer, and ii) a portion the first semiconductor layer that does not correspond to the gate electrode.

In the method, a doping density of the portion of the first semiconductor layer is heavier than a doping density of the second semiconductor layer 19. In the method, the gate electrode and second capacitor electrode are located at substantially the same distance from the substrate. In the method, the gate electrode and second capacitor electrode are located directly above the semiconductor layer and the first capacitor electrode, respectively.

DETAILED DESCRIPTION OF CERTAIN INVENTIVE EMBODIMENTS

Figure 1A:
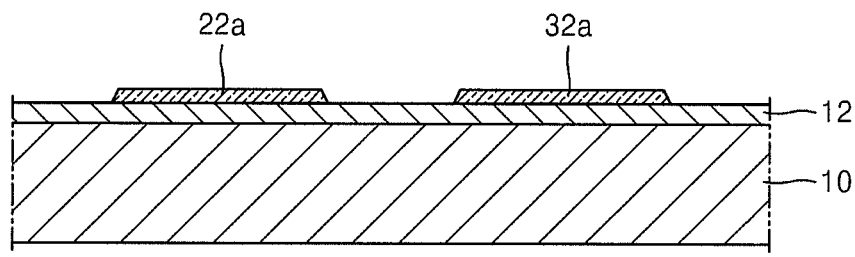
FIGS. 1A through 1F are diagrams for describing a manufacturing process of a substrate having a capacitor and a thin film transistor (TFT).
Figure 1B:
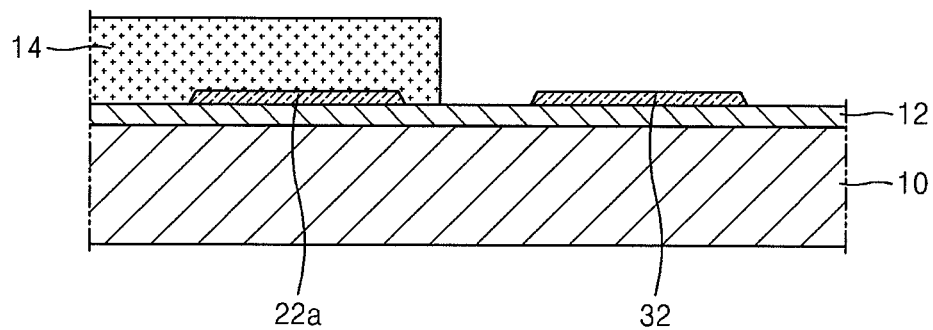
Figure 1C:
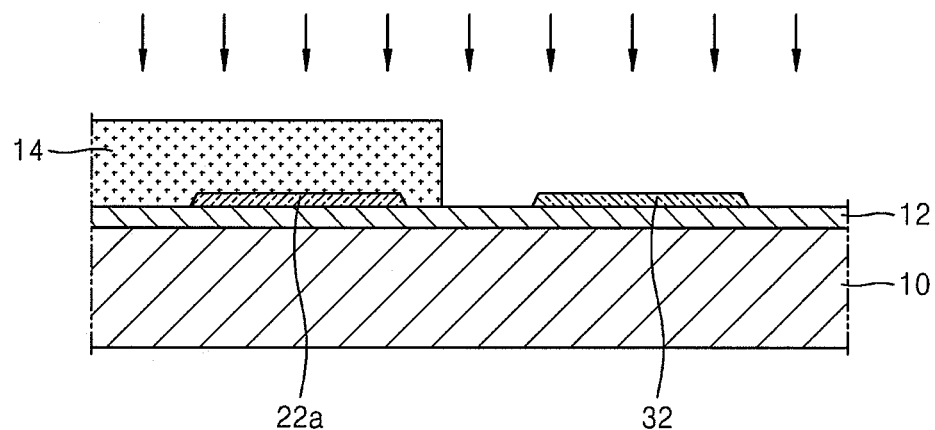
Figure 1D:
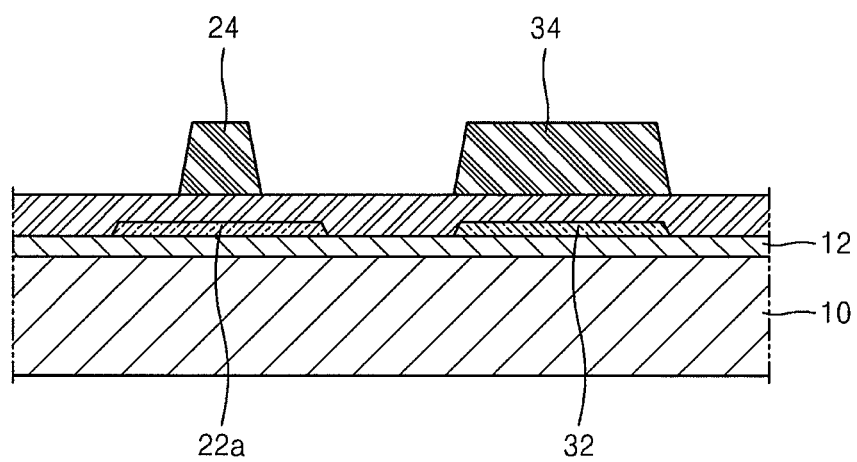
Figure 1E:
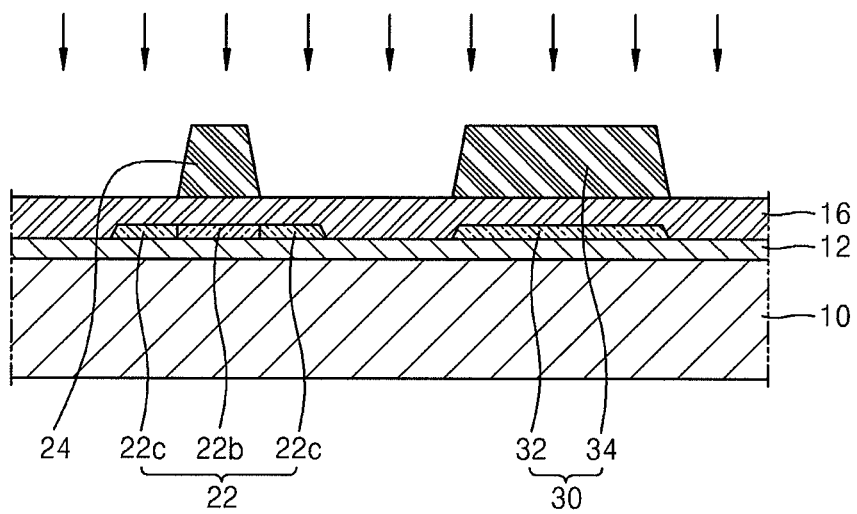
Figure 1F:
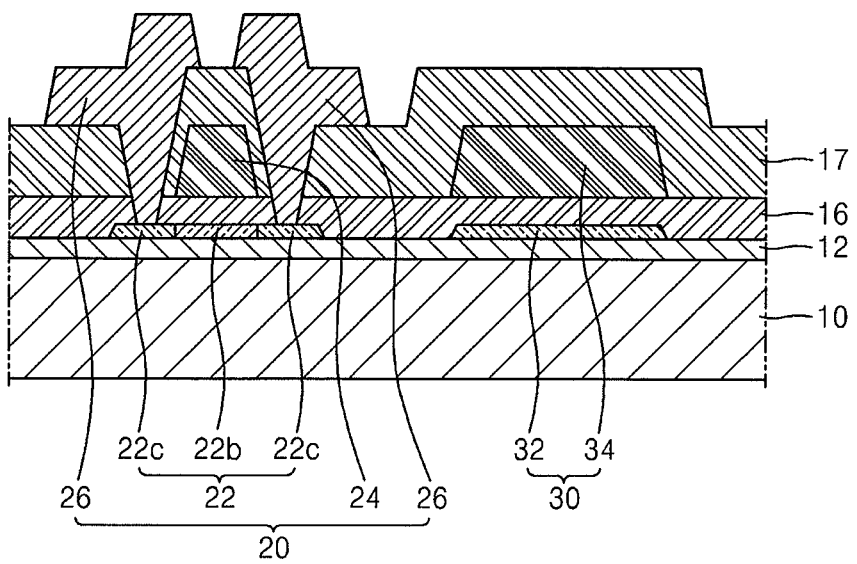

FIGS. 1A through 1F are diagrams for describing a manufacturing process of a substrate having a capacitor and a TFT. Referring to FIGS. 1A through 1F, as illustrated in FIG. 1A, a buffer layer 12 is formed on a substrate 10, and patterned semiconductor layers 22a and 32a are formed on the buffer layer 12. After that, as illustrated in FIG. 1B, a photoresist 14 covers the semiconductor layer 22a to be formed as a TFT 20, and then, as illustrated in FIG. 1C, an ion doping process is performed on the semiconductor layer 32a to be formed as a first capacitor electrode 32 so that the semiconductor layer 32a reaches a predetermined conductivity, thereby forming the first capacitor electrode 32. After that, the photoresist 14 is removed, and an insulating layer 16 is formed to cover the semiconductor layer 22a and the first capacitor electrode 32. After that, as illustrated in FIG. 1D, a gate electrode 24 is formed on a top surface of the semiconductor layer 22a, and a second capacitor electrode 34 is formed on a top surface of the first capacitor electrode 32. Then, as illustrated in FIG. 1E, by using the gate electrode 24 as a blocking layer, the semiconductor layer 22a is doped, except for a portion which corresponds to the gate electrode 24 and which is of the semiconductor layer 22a. By doing so, a semiconductor layer 22 having a channel region 22b and a source/drain region 22c is formed. After that, an intermediate insulating layer 17 is formed to cover the gate electrode 24 and the second capacitor electrode 34, contact holes are formed in the insulating layer 16 and the intermediate insulating layer 17 so as to expose the source/drain region 22c of the semiconductor layer 22, and then source/drain electrodes 26 are formed, thereby completing the manufacture of the substrate 10 having a capacitor 30 and the TFT 20.

However, according to the above manufacturing process of the substrate having the capacitor and the TFT, in order to form the first capacitor electrode 32, the photoresist 14 has to cover the semiconductor layer 22a, and then has to be removed. Also, a plurality of ion doping processes have to be performed to form the first capacitor electrode 32, and to form the source/drain region 22c of the semiconductor layer 22. Thus, the above manufacturing process is complicated, and the manufacturing costs increase since the number of manufacturing materials such as the photoresist 14 increases.

Embodiments of the present invention will now be described more fully with reference to the accompanying drawings, in which exemplary embodiments of the invention are shown.

FIGS. 2A through 2D are diagrams for describing a method of manufacturing a substrate (or a semiconductor circuit) having a capacitor and a thin film transistor (TFT) according to an embodiment of the present invention.

Figure 2A:
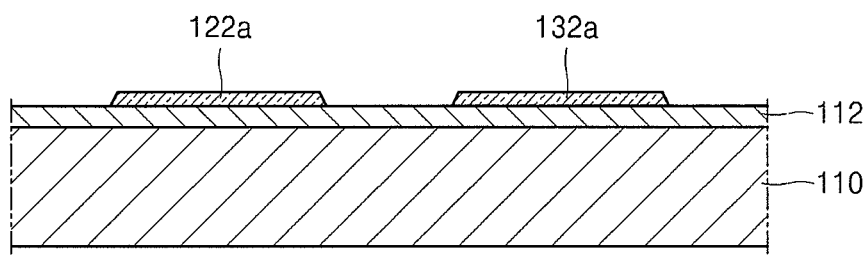
FIGS. 2A through 2D are diagrams for describing a method of manufacturing a substrate having a capacitor and a TFT according to an embodiment of the present invention.

First, as illustrated in FIG. 2A, a buffer layer 112 is formed on a substrate 110, and a semiconductor layer 122a to be formed as a TFT 120 and a semiconductor layer 132a to be formed as a first capacitor electrode 132 are formed on the buffer layer 112. The buffer layer 112 may be selectively formed, that is, it is possible to form the semiconductor layer 122a and the semiconductor layer 132a on the substrate 110 without forming the buffer layer 112. If required, it may also be possible to form another layer except for the buffer layer 112, or the other layer as well as the buffer layer 112 on the substrate 110, and then to form the semiconductor layer 122a and the semiconductor layer 132a on the other layer.

For the substrate 110, not only a glass material substrate but also a plastic material substrate using various plastics such as acryl may be used. Also, a metal plate may be used to form the substrate 110. The buffer layer 112 may be formed of a material such as silicone oxide or silicone nitride. The semiconductor layer 122a and the semiconductor layer 132a may be formed by forming an amorphous silicon layer and then crystallizing the amorphous silicon layer, may be an amorphous silicon layer, or may be formed of other semiconductor materials. A semiconductor layer may be formed on an entire surface of the substrate 110, and then may be patterned to form the semiconductor layer 122a and the semiconductor layer 132a.

Figure 2B:
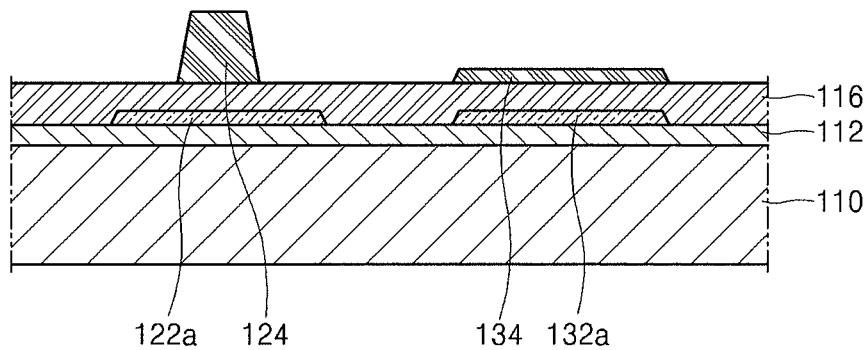

After that, an insulating layer 116 is formed of an insulating material such as silicone oxide or silicone nitride so as to cover the semiconductor layer 122a and the semiconductor layer 132a, and as illustrated in FIG. 2B, a gate electrode layer 124 and a second capacitor electrode 134 are formed on the insulating layer 116. The gate electrode 124 and the second capacitor electrode 134 may be formed of conductive materials such as molybdenum, tungsten, titanium, and a composition thereof. The gate electrode 124 is formed to correspond to a portion of the semiconductor layer 122a, and the second capacitor electrode 134 is formed to correspond to the semiconductor layer 132a, in such a manner that a thickness of the gate electrode 124 is greater than a thickness of the second capacitor electrode 134. To simplify the manufacturing process, the gate electrode 124 and the second capacitor electrode 134 may be substantially simultaneously formed. For example, by using a half-tone mask, it is possible to substantially simultaneously form the second capacitor electrode 134 and the gate electrode 124, in such a manner that the thickness of the gate electrode 124 is greater than the thickness of the second capacitor electrode 134.

Figure 2C:
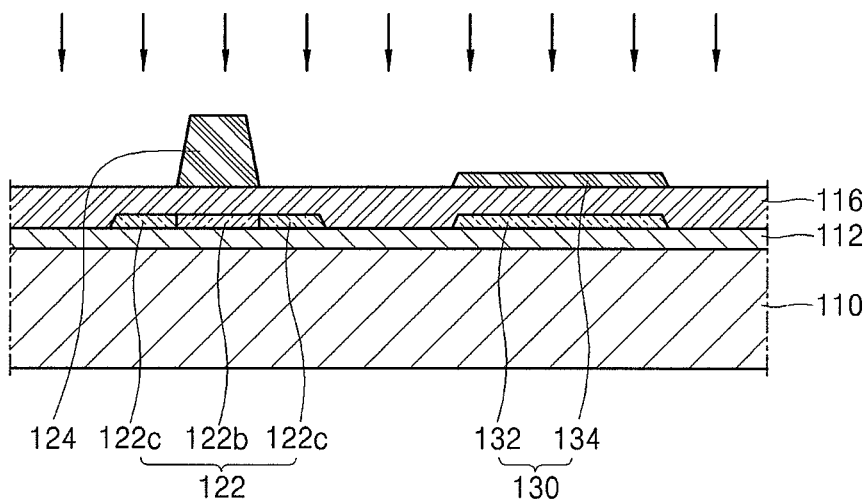

After that, as illustrated in FIG. 2C, a doping process is performed. In the doping process, dopants are injected into the semiconductor layer 122a (refer to FIG. 2B) and the semiconductor layer 132a (refer to FIG. 2B). At this time, since the thickness of the second capacitor electrode 134 is small, the dopants pass through the second capacitor electrode 134 and the insulating layer 116, and are injected into the semiconductor layer 132a (refer to FIG. 2B) so that the semiconductor layer 132a (refer to FIG. 2B) obtains conductivity, thereby forming the first capacitor electrode 132 (refer to FIG. 2C). The dopants are also injected into the semiconductor layer 122a (refer to FIG. 2B). However, since the thickness of the gate electrode 124 is large, the gate electrode 124 serves as a blocking layer or a partial blocking layer. Thus, the dopants are injected into only a portion of the semiconductor layer 122a (refer to FIG. 2B) that does not correspond to the gate electrode 124, so that the semiconductor layer 122a (refer to FIG. 2B) becomes a semiconductor layer 122 (refer to FIG. 2C) having a channel region 122b (refer to FIG. 2C) and a source/drain region 122c (refer to FIG. 2C). In one embodiment, the thickness of the gate electrode 124 ranges from about 1000 Å to about 5000 Å. In a certain embodiment, when the thickness of the gate electrode 124 is approximately 5000 Å, the gate electrode 124 may serve as the blocking layer which prevents the dopants from being injected into a portion of the semiconductor layer 122a that corresponds to the gate electrode 124. In a certain embodiment, when the thickness of the second capacitor electrode 134 is less than about 1000 Å, the dopants may effectively pass through the second capacitor electrode 134. Depending on circumstances (e.g., materials of the second capacitor electrode 134) or embodiments, the thickness of the gate electrode 124 may be less than about 1000 Å or greater than about 5000 Å.

Various kinds of materials may be used as the dopants. For example, ions such as B+, P+, As+ and/or Sb+ may be used. In particular, when such ions are doped, by increasing an acceleration voltage of the ions, the dopants may pass through the second capacitor electrode 134 and the insulating layer 116, and may be injected into the semiconductor layer 132a.

Figure 2D:
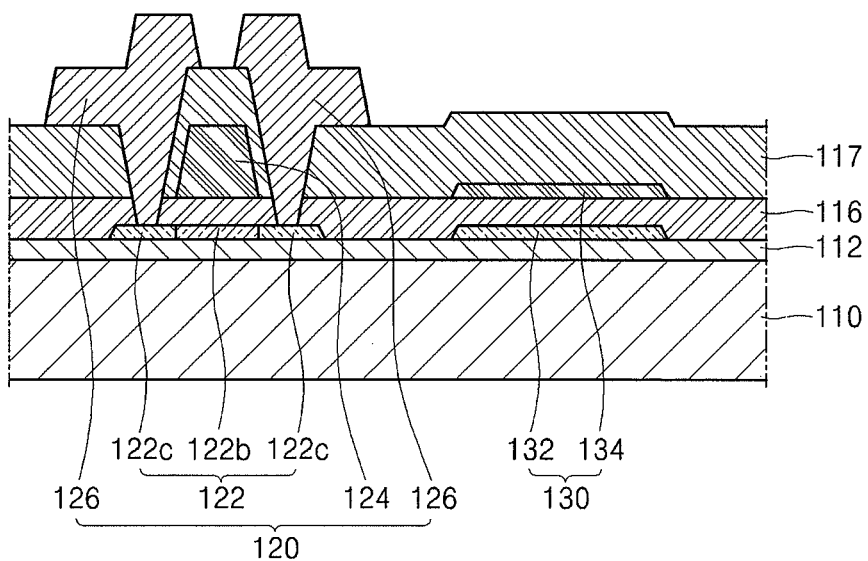

After that, an intermediate insulating layer 117 is formed of an insulating material such as silicone oxide or silicone nitride so as to cover the gate electrode 124 and the second capacitor electrode 134, contact holes are formed in the insulating layer 116 and the intermediate insulating layer 117 so as to expose the source/drain region 122c of the semiconductor layer 122, and then source/drain electrodes 126 are formed of a conductive material such as molybdenum, tungsten, etc, so that the manufacture of the substrate 110 having a capacitor 130 and the TFT 120 is completed as illustrated in FIG. 2D.

In one embodiment, the first capacitor electrode 132 that is conductive and formed of the doped semiconductor layer and the semiconductor layer 122 are disposed on the same layer, and the insulating layer 116 covers the semiconductor layer 122 and the first capacitor electrode 132. Also, the gate electrode 124 corresponding to the portion of the semiconductor layer 122, and the second capacitor electrode 134 corresponding to the first capacitor electrode 132 are disposed on the insulating layer 116, in such a manner that the thickness of the gate electrode 124 is greater than the thickness of the first capacitor electrode 132. According to the method of manufacturing the substrate 110 having the capacitor 130 and the TFT 120, a photoresist is not used, and the number of ion doping processes is reduced, so that it is possible to simplify the manufacturing process and to substantially reduce the manufacturing costs, compared to the manufacturing process described with reference to FIGS. 1A through 1F.

Meanwhile, in the doping process illustrated in FIG. 2C, the dopants pass through the second capacitor electrode 134 and the insulating layer 116 so as to be injected into the semiconductor layer 132a. However, the dopants pass through only the insulating layer 116 so as to be injected into the portion of the semiconductor layer 122a which does not correspond to the gate electrode 124. Thus, in the doping process, a doping density of the portion of the semiconductor layer 122a which does not correspond to the gate electrode 124 becomes heavier than a doping density of the semiconductor layer 132a. As a result, in the resultant product that is the substrate 110 having the capacitor 130 and the TFT 120, a doping density of a portion of the semiconductor layer 122 which does not correspond to the gate electrode 124 becomes heavier than a doping density of the first capacitor electrode 132.

In another embodiment, the semiconductor layer 132a and the semiconductor layer 122a may not be simultaneously doped by using a mask but may be doped according to a time interval, may be doped with different dopants, or may be heavily or lightly doped with dopants. However, if the semiconductor layer 132a and the semiconductor layer 122a is substantially simultaneously doped as described above, the manufacturing process is simplified. In this case, the portion of the semiconductor layer 122 which does not correspond to the gate electrode 124 is doped with the same dopants as a doped semiconductor layer which forms the first capacitor electrode 132.

Figure 3A:
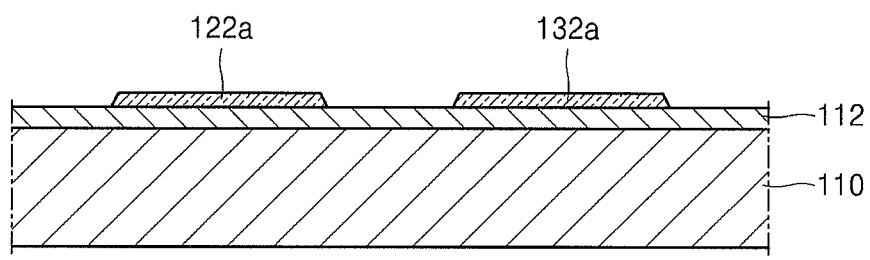
FIGS. 3A through 3E are diagrams for describing a method of manufacturing a substrate having a capacitor and a TFT according to another embodiment of the present invention.
Figure 3B:
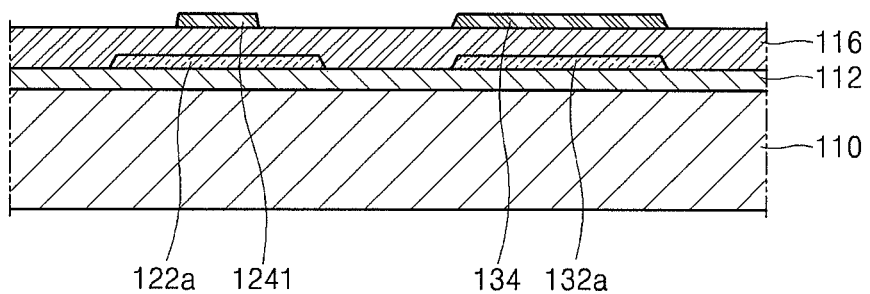
Figure 3C:
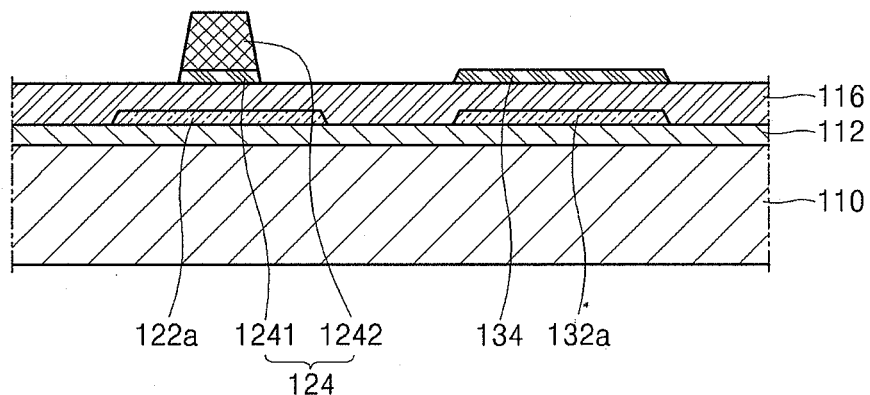
Figure 3D:
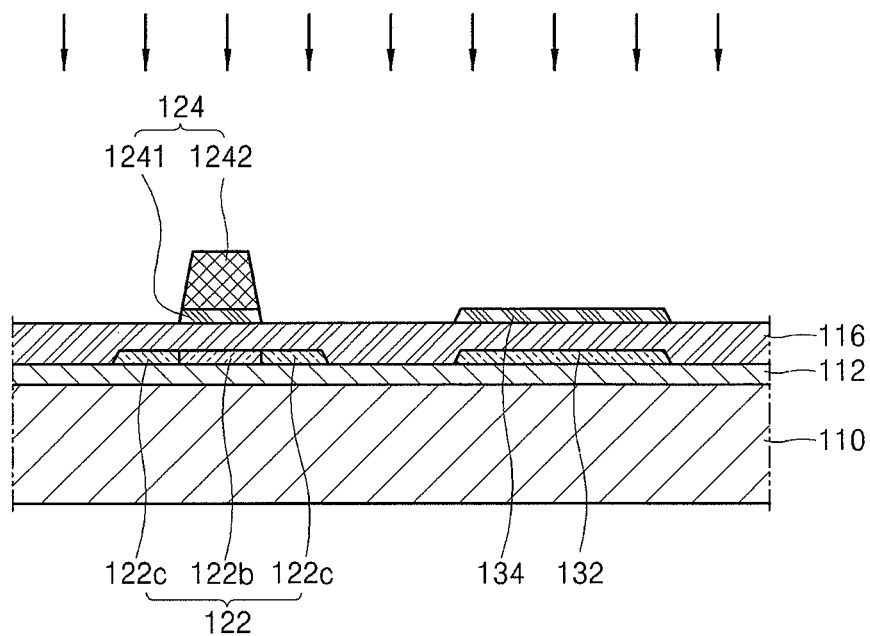
Figure 3E:
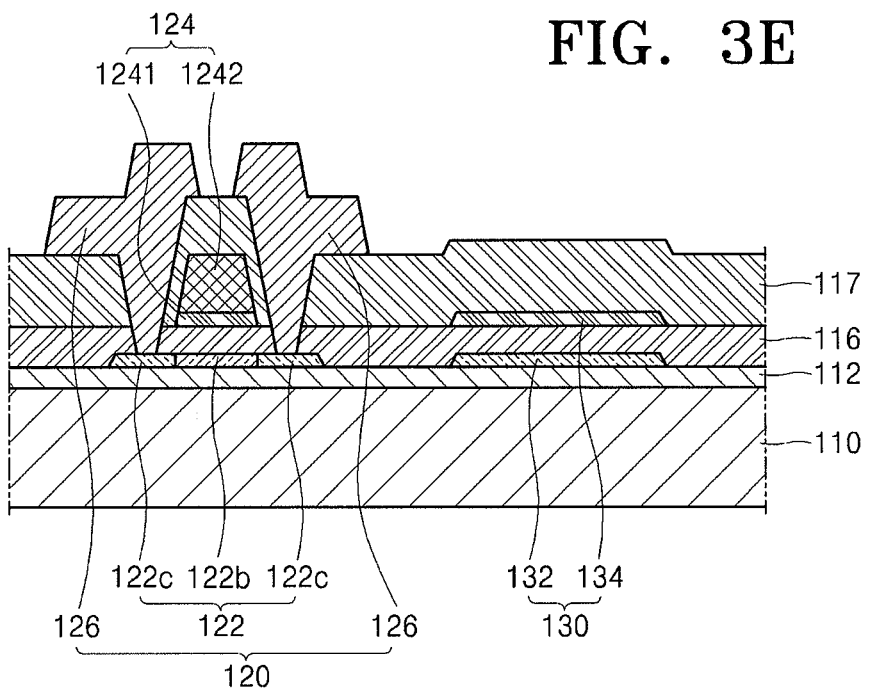

FIGS. 3A through 3E are diagrams for describing a method of manufacturing a substrate (or a semiconductor circuit) having a capacitor and a TFT according to another embodiment of the present invention. As illustrated in FIG. 3, a semiconductor layer 122a to be formed as a TFT 120 and a semiconductor layer 132a to be formed as a first capacitor electrode 132 are formed on a top surface of a substrate 110. After that, an insulating layer 116 is formed to cover the semiconductor layer 122a and the semiconductor layer 132a. As illustrated in FIG. 3B, a first conductive layer 1241 corresponding to a portion of the semiconductor layer 122a, and a second capacitor electrode 134 corresponding to the semiconductor layer 132a are formed on the insulating layer 116. It may also be possible to substantially simultaneously form the first conductive layer 1241 and the second capacitor electrode 134 by using the same material, in such a manner that the first conductive layer 1241 and the second capacitor electrode 134 have the same thickness. After that, as illustrated in FIG. 3C, a second conductive layer 1242 is formed on the first conductive layer 1241 so as to form a gate electrode 124 including the first conductive layer 1241 and the second conductive layer 1242. After that, as illustrated in FIG. 3D, a doping process is performed. In the doping process, a portion of the semiconductor layer 122a which does not correspond to the gate electrode 124, and the semiconductor layer 132a are substantially simultaneously doped to form a semiconductor layer 122 having a channel region 122b and a source/drain region 122c, and the first capacitor electrode 132. After that, an intermediate insulating layer 117 is formed of an insulating material such as silicone oxide or silicone nitride so as to cover the gate electrode 124 and the second capacitor electrode 134, contact holes are formed in the insulating layer 116 and the intermediate insulating layer 117 so as to expose the source/drain region 122c of the semiconductor layer 122, and then source/drain electrodes 126 are formed of a conductive material such as molybdenum, tungsten, etc, so that the substrate 110 having a capacitor 130 and the TFT 120 is manufactured, as illustrated in FIG. 3E.

In one embodiment, as illustrated in FIG. 3E, the substrate 110 having the capacitor 130 and the TFT 120 is formed. In this embodiment, in the substrate 110, the first capacitor electrode 132 that is conductive and formed of the doped semiconductor layer, and the semiconductor layer 122 are disposed on the same layer, and the insulating layer 116 covers the semiconductor layer 122 and the first capacitor electrode 132. Also, the gate electrode 124 corresponding to the portion of the semiconductor layer 122, and the second capacitor electrode 134 corresponding to the first capacitor electrode 132 are disposed on the insulating layer 116, in such a manner that the gate electrode 124 has the first conductive layer 1241 having substantially the same thickness as the second capacitor electrode 134, and the second conductive layer 1242 disposed on the first conductive layer 1241. According to the method of manufacturing the substrate 110 having the capacitor 130 and the TFT 120, a photoresist is not used, and the number of ion doping processes is reduced, so that it is possible to simplify a manufacturing process and to substantially reduce manufacturing costs, compared to the conventional manufacturing process described with reference to FIGS. 1A through 1F.

Meanwhile, in the doping process illustrated in FIG. 3D, the dopants pass through the second capacitor electrode 134 and the insulating layer 116 so as to be injected into the semiconductor layer 132a. However, the dopants pass through only the insulating layer 116 so as to be injected into the portion of the semiconductor layer 122a which does not correspond to the gate electrode 124. Thus, in the doping process, a doping density of the portion of the semiconductor layer 122a which does not correspond to the gate electrode 124, becomes heavier than a doping density of the semiconductor layer 132a. As a result, in the substrate 110 having the capacitor 130 and the TFT 120, a doping density of a portion of the semiconductor layer 122 which does not correspond to the gate electrode 124, becomes heavier than a doping density of the first capacitor electrode 132.

Figure 4:
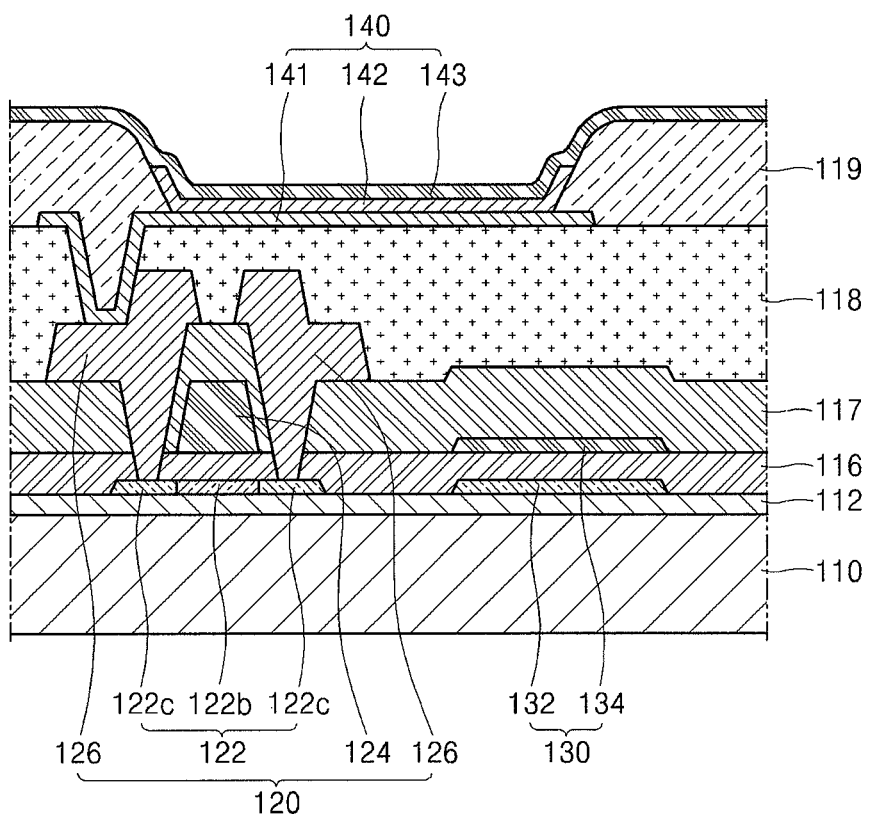
FIG. 4 is a cross-sectional view of a flat panel display, according to an embodiment of the present invention.

FIG. 4 is a cross-sectional view of a flat panel display, according to an embodiment of the present invention.

In one embodiment, after a substrate having a capacitor 130 and a TFT 120 as illustrated in FIG. 2D is formed, a light emitting device 140 is electrically connected to at least one of source/drain electrodes 126 of the TFT 120. In FIG. 4, a planarization layer (or, a protective layer) 118 is formed of silicone oxide, silicone nitride, and/or acryl so as to cover the capacitor 130 and the TFT 120, and the light emitting device 140 is formed on the planarization layer 118. In one embodiment, the light emitting device 140 is an organic light emitting diode (OLED) including a pixel electrode 141, a counter electrode 143, and an intermediate layer 142 that is interposed between the pixel electrode 141 and the counter electrode 143, and that includes at least an emission layer (EML), but the present invention is not limited thereto. Reference numeral 119 in FIG. 4 represents a pixel defining layer formed of silicone nitride and/or silicone oxide.

Figure 5:
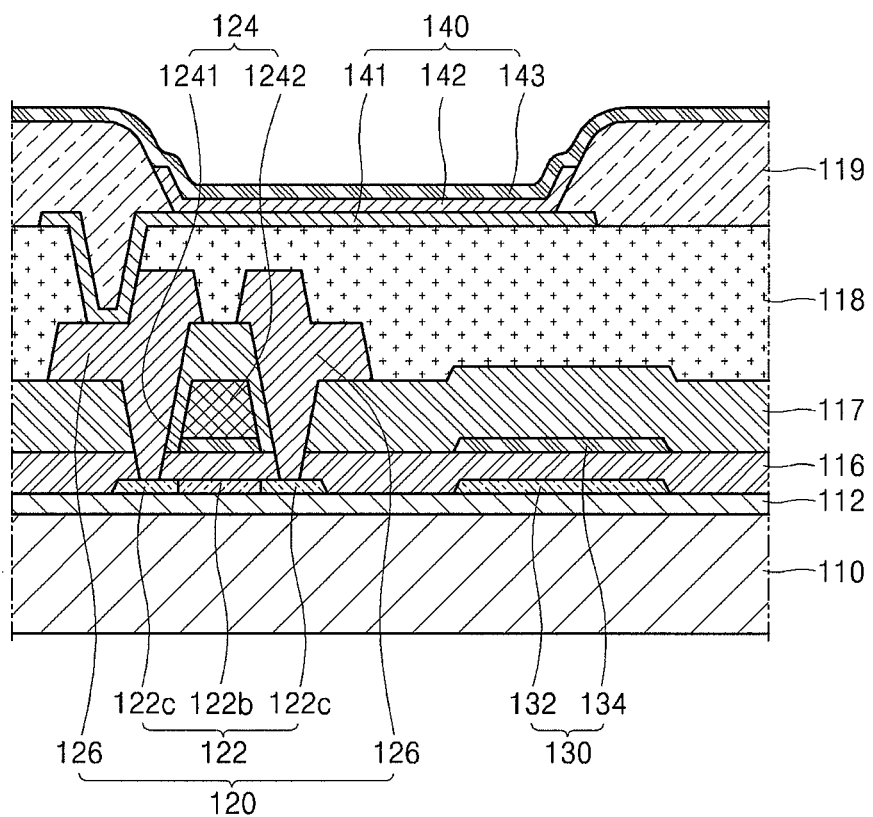
FIG. 5 is a cross-sectional view of a flat panel display, according to another embodiment of the present invention.

In one embodiment, when emission of each of pixels (subpixels) is controlled by a TFT and a capacitor which are electrically connected to each of the pixels (the subpixels), and when the substrate 110 having the capacitor 130 and the TFT 120, it is possible to simplify a manufacturing process of the flat panel display and to substantially reduce manufacturing costs. Also, one embodiment of the present invention may be implemented by using not only the substrate 110 having the capacitor 130 and the TFT 120 illustrated in FIG. 2D but also by using the substrate 110 that has the capacitor 130 and the TFT 120 illustrated in FIG. 3E and that is used in a flat panel display of FIG. 5.

According to at least one embodiment of the present invention, the method of manufacturing the substrate having the capacitor and the TFT can simplify a manufacturing process and can substantially reduce manufacturing costs.

While this invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A semiconductor circuit having a capacitor and a thin film transistor (TFT), comprising:
   a substrate;
   a semiconductor layer and a first capacitor electrode formed on the substrate, the first capacitor electrode being doped to be conductive;
   an insulating layer covering the semiconductor layer and the first capacitor electrode;
   a gate electrode disposed on the insulating layer and corresponding to a portion of the semiconductor layer, wherein the thickness of the gate electrode is greater than 1000 Å and less than 5000 Å;
   a second capacitor electrode disposed on the insulating layer and corresponding to the first capacitor electrode, wherein the gate electrode comprises a first conductive layer corresponding to the portion of the semiconductor layer and a second conductive layer disposed on the first conductive layer, wherein the second conductive layer is substantially thicker than the first conductive layer and the second capacitor electrode, wherein the first conductive layer and the second capacitor electrode are formed of the same material and wherein the first and second conductive layers are configured to block dopants during an ion doping process and the second capacitor electrode is configured to pass through the dopants during the ion doping process; and
   an intermediate insulating layer formed directly on the insulating layer, the second conductive layer and the second capacitor electrode, wherein the intermediate insulating layer includes:
      a first portion formed directly over the second conductive layer,
      a second portion formed directly over the second capacitor electrode, and a third portion formed directly over the insulating layer,
wherein a second distance between a top surface of the second portion and a top surface of the substrate is greater than a third distance between a top surface of the third portion and the top surface of the substrate, and
wherein the second distance is less than a first distance between a top surface of the first portion and the top surface of the substrate.

2. The semiconductor circuit of claim 1, wherein a portion of the semiconductor layer that does not correspond to the gate electrode is doped with the same dopants as the first capacitor electrode.

3. The semiconductor circuit of claim 2, wherein a doping density of the portion of the semiconductor layer is heavier than a doping density of the first capacitor electrode.

4. The semiconductor circuit of claim 1, wherein the first conductive layer and the second capacitor electrode have substantially the same thickness.

5. The semiconductor circuit of claim 1, wherein the semiconductor layer and the first capacitor electrode have substantially the same thickness.

6. The semiconductor circuit of claim 1, wherein the gate electrode and second capacitor electrode are located at substantially the same distance from the substrate.

7. The semiconductor circuit of claim 1, wherein the gate electrode and second capacitor electrode are located directly above the semiconductor layer and the first capacitor electrode, respectively.

8. A flat panel display, comprising:
a thin film transistor (TFT) and capacitor circuit including:
　a semiconductor layer and a first capacitor electrode formed on a substrate layer, the first capacitor electrode being doped to be conductive,
　an insulating layer covering the semiconductor layer and the first capacitor electrode,
　a gate electrode disposed on the insulating layer and corresponding to a portion of the semiconductor layer,
　a second capacitor electrode disposed on the insulating layer and corresponding to the first capacitor electrode and
　an intermediate insulating layer formed directly on the insulating layer, the second conductive layer and the second capacitor electrode,
　wherein the gate electrode comprises a first conductive layer corresponding to the portion of the semiconductor layer and a second conductive layer disposed on the first conductive layer,
　wherein the second conductive layer is substantially thicker than the first conductive layer and the second capacitor electrode,
　wherein the first conductive layer and the second capacitor electrode are formed of the same material and wherein the first and second conductive layers are configured to block dopants during an ion doping process and the second capacitor electrode is configured to pass through the dopants during the ion doping process,
　wherein the thickness of the gate electrode is greater than 1000 Å and less than 5000 Å,
　wherein the intermediate insulating layer includes:
　　a first portion formed directly over the second conductive layer,
　　a second portion formed directly over the second capacitor electrode, and
　　a third portion formed directly over the insulating layer,
　wherein a second distance between a top surface of the second portion and a top surface of the substrate is greater than a third distance between a top surface of the third portion and the top surface of the substrate, and
　wherein the second distance is less than a first distance between a top surface of the first portion and the top surface of the substrate;
source and drain electrodes contacting the semiconductor layer; and
a light emitting device electrically connected to at least one of the source and drain electrodes.

* * * * *